(12) United States Patent
Cathelin et al.

(10) Patent No.: US 7,345,554 B2
(45) Date of Patent: Mar. 18, 2008

(54) INTEGRABLE PHASE-LOCKED LOOP INCLUDING AN ACOUSTIC RESONATOR

(75) Inventors: Andreia Cathelin, Laval (FR); Didier Belot, Rives (FR)

(73) Assignee: STMicroelectronics S.A., Montrouge (FR)

( * ) Notice: Subject to any disclaimer, the term of this patent is extended or adjusted under 35 U.S.C. 154(b) by 65 days.

(21) Appl. No.: 11/025,775

(22) Filed: Dec. 29, 2004

(65) Prior Publication Data

US 2005/0189998 A1 Sep. 1, 2005

(30) Foreign Application Priority Data

Dec. 29, 2003 (FR) .................................. 03 15480
Apr. 2, 2004 (FR) .................................. 04 03493

(51) Int. Cl.
*H03B 5/30* (2006.01)
(52) U.S. Cl. ................ 331/154; 331/167; 331/117 FE; 331/117 R; 331/177 V
(58) Field of Classification Search ............ 331/107 A, 331/107 DP, 177 V, 167, 154, 117 FE, 117 R, 331/108 C
See application file for complete search history.

(56) References Cited

U.S. PATENT DOCUMENTS

| | | | |
|---|---|---|---|
| 5,043,681 A | 8/1991 | Tanemura et al. ....... | 331/107 A |
| 6,950,639 B2 * | 9/2005 | Gogolla et al. .......... | 455/196.1 |
| 7,030,718 B1 | 4/2006 | Scherer .................... | 333/188 |
| 2001/0028277 A1 | 10/2001 | Northam .................. | 331/34 |
| 2004/0227578 A1 | 11/2004 | Hamalainen | |
| 2005/0266823 A1 | 12/2005 | Cathelin et al. ........... | 455/344 |

FOREIGN PATENT DOCUMENTS

| | | |
|---|---|---|
| DE | 10234685 A1 | 2/2004 |
| FR | 2 455 816 | 11/1980 |
| GB | 615841 | 1/1949 |
| WO | WO 02/25813 A1 | 3/2002 |
| WO | 2004/066495 A1 | 8/2004 |

OTHER PUBLICATIONS

Akbari-Dilmaghani, R., et al., "A High Q RF CMOS Differential Active Inductor," in Proceedings of the IEEE Electronics, Circuits and Systems Int'l. Conference, Lisboa, Portugal, Sep. 7-10, 1998, pp. 157-160.
Koroglu, M., et al., "A 1.9Ghz Image-Reject Front-End with Automatic Tuning in a 0.15μm CMOS Technology," in Proceedings of the IEEE Int'l. Solid State Circuits Conference, San Francisco, CA, Feb. 9-13, 2003, pp. 1-10.

* cited by examiner

*Primary Examiner*—Arnold Kinkead
(74) *Attorney, Agent, or Firm*—Lisa K. Jorgenson; Dennis M. de Guzman; Seed IP Law Group PLLC

(57) ABSTRACT

A phase-locked loop that can be integrated into a semiconductor product comprises: a phase comparator having a first input, a second input and an output, said first input receiving a reference frequency; a low-pass filter having an input connected to said output of said phase comparator and having an output generating an electric control signal ($V_{tune}$); an oscillating circuit generating a predefined frequency signal to be controlled; a dividing block having an input receiving the oscillating signal and an output connected to said second input of said phase comparator. The oscillating circuit comprises a BAW-type acoustic resonator having first and second resonant frequencies and associated with a first inductive partner element to cancel out said second resonant frequency and with a second capacitive partner element for regulating said first resonant frequency, said at least first resonator component being adjusted via said electric signal ($V_{tune}$).

25 Claims, 4 Drawing Sheets

INTEGRABLE PHASE-LOCKED LOOP INCLUDING AN ACOUSTIC RESONATOR

BACKGROUND OF THE INVENTION

1. Field of the Invention

The present disclosure generally relates to micro-electronic circuits and in particular but not exclusively, a phase-locked loop that can be integrated into an integrated circuit and equipped with an acoustic resonator.

2. Description of the Related Art

Phase-Locked Loops (PLL) are current electronic circuits that are used in many applications.

They are particularly used in telecommunication systems and specially in mobile telephony where integration of transmitter and receiver electronic circuits within a single semiconductor product, is sought.

The following document "DESIGN TECHNIQUES FOR AUTOMATICALLY TUNED INTEGRATED GIGA-HERTZ-RANGE ACTIVE LC FILTERS," Dandan Li, Yannis Tsividis, IEEE Journal of Solid State Circuits, vol. 37, No. 8, August 2002 describes a control technique using a phase-locked loop.

U.S. Patent 2004/0033794 entitled "RESONATOR CONFIGURATION," published on Feb. 19, 2004 discloses a process for tuning a resonator mounted on an integrated circuit by means of a second reference resonator also mounted on the same substrate. The reference resonator is used in a VCO-type (Voltage Control Oscillator) circuit to generate a local oscillation frequency. This patent does not indicate how to practically proceed to obtain a precise and effective tuning of the circuit using the resonator.

BRIEF SUMMARY OF THE INVENTION

With the development of the most recent techniques as regards communication, and in particular in mobile telephony, one seeks to design amplitude-locked loops that would be more efficient than known loops—based on passive components and transistors—and would however allow complete integration on a single silicon substrate.

Such is addressed by one or more embodiments of the present invention.

An embodiment of the present invention provides a powerful phase-locked loop that includes an acoustic resonator and can be integrated into a semiconductor product.

Another embodiment of this invention provides an entirely integrable phase-locked loop that is adapted to mobile communications.

One embodiment of the invention provides a phase-locked loop that can be integrated into a semiconductor product and comprising:

a phase comparator having a first input, a second input and an output, said first input receiving a reference frequency;

a low-pass filter having an input connected to said output of said phase comparator and having an output generating said electric control signal ($V_{tune}$);

an oscillator circuit generating a signal having a predetermined frequency to be controlled, comprising a BAW-type acoustic resonator having a resonant frequency and an antiresonant frequency;

a dividing block having an input receiving the oscillating signal and an output connected to said second input of said phase comparator.

The phase-locked loop according to an embodiment of the invention is characterized in that the BAW-type resonator is associated with a first inductive partner element set in the vicinity of said resonant and antiresonant frequencies and is also associated with a second adjustable capacitive partner element allowing setting of said acoustic resonator's characteristics.

Both partner elements can be tuned via electric signal ($V_{tune}$).

Thus, a powerful phase-locked loop is obtained, which is based on the high quality coefficient of the BAW resonator, and is entirely integrable on a single substrate.

In a particular embodiment, the first partner element is a spiral inductor arranged on the same semiconductor substrate and set in the vicinity of the resonant and antiresonant frequencies.

In an embodiment, the first partner element is an active inductor made up of a gyrator and a capacitive element, one of the elements being adjustable by said electric control signal.

In another embodiment, the second partner element is a varactor that can be adjusted by said electric control signal.

In another embodiment, the gyrator comprises a pair of transconductance amplifiers whose polarization point is set by said electric signal.

BRIEF DESCRIPTION OF THE SEVERAL VIEWS OF THE DRAWINGS

Other features of one or more embodiments of the invention will best be understood by reference to the following detailed description when read in conjunction with the accompanying drawings, wherein.

DETAILED DESCRIPTION

Embodiments of an integrable phase-locked loop including an acoustic resonator are described herein. In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

We will now more specifically describe an embodiment of a circuit comprising an integrated resonator according to the present invention, and adapted to the design of an RF signal receive circuit that can be used in mobile telephony in particular.

In mobile telephony, and in particular in the most recent applications such as Wide Code Division Multiplexing Access (WCDMA), there is a need for realizing a particularly effective filtering in order to separate extremely close channels. It should be noted that this is only one nonrestrictive example of use of the new integrable acoustic component, the characteristics of which will now be disclosed.

An embodiment of the invention is based on the use of a new acoustic component, hereafter designated by the expression *Tunable Resonator component* (TRC)—as described in French patent application No. 0315480 (ref. 03-GR1-267) filed on Dec. 29, 2003, and the principal characteristics of which will be summarized hereafter—for clarity's sake.

To this end, an acoustic resonator based on a dielectric medium arranged on a reflecting element, such as a Bragg mirror or a receiver for example, is used. Layers having different acoustic properties and different dielectric constants are stacked on a silicon substrate. Such an acoustic element is known as a Surface Mounted Resonator (SMR).

Alternatively, the resonator could be a Film Bulk Acoustic Resonator (FBAR), namely a resonator located above a cavity to allow the reflection of acoustic waves and to avoid damping thereof.

Figure 1A:
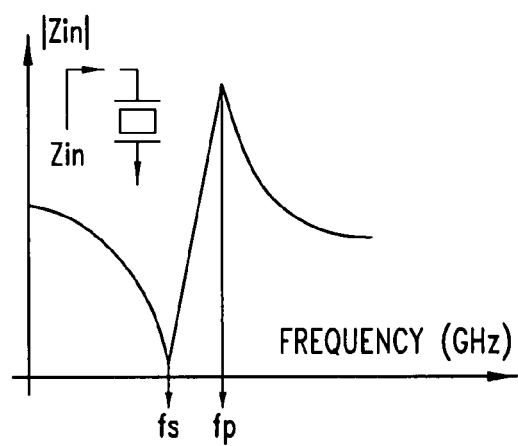
FIG. 1a illustrates an impedance curve of an example BAW-type acoustic resonator.
Figure 1B:
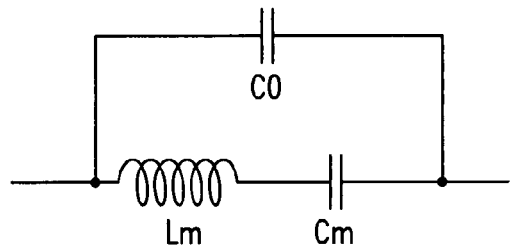
FIGS. 1b and 1c show the equivalent electric diagram of an example BAW-type acoustic resonator, respectively in series and parallel.

The BAW resonator has two very close resonant frequencies, $f_s$ (series) and $f_p$ (parallel) respectively, as illustrated in FIG. 1a. When referring to an equivalent electric diagram shown in FIG. 1b, it amounts to considering two LC-type resonator circuits, series and parallel respectively, composed of elements Lm, Cm and C0.

In the known approach, both resonant circuits are simultaneously used for filtering, as it is the case in document "RF MEMS CIRCUIT DESIGN FOR WIRELESS COMMUNICATIONS," Hector J De Los Santos, Artech House, ISBM 1-58033 329-9, 2002, p. 163 and following, for example.

On the contrary, in the new approach that is proposed, the TRC comprises a BAW resonator which is associated with at least two partner elements and, in an embodiment, with a first inductive partner element, variable or fixed, active or passive, and with a second generally variable capacitive partner element.

It has been noted that there is a great advantage in choosing a first partner element that is inductive and set close to the resonant and antiresonant frequencies. In a particular embodiment, a spiral inductor integrated directly on the silicon substrate is used.

Alternatively, the first partner element is a variable inductor set in the vicinity of the resonant and antiresonant frequencies, according to an electric signal $V_{tune}$.

The second partner element is a capacitive element and it generally varies according to an electric signal, for example electric signal $V_{tune}$.

By controlling said electric signal $V_{tune}$ it is possible to considerably modify the characteristics of Tunable Resonator Component composed of the acoustic resonator and its two partner elements.

It was observed that the combination of partner elements chosen as mentioned above made it possible to adjust the characteristics of the TRC to a large extent, and in particular the characteristics of any integrated electronic circuit comprising such TRC, without affecting too much the overall performance of this circuit (resonant and antiresonant frequencies, quality factor).

Then, inaccuracies in the manufacturing process and temperature sensitivity can be corrected and it is even possible to have a means for tuning the new acoustic component.

Figure 2A:
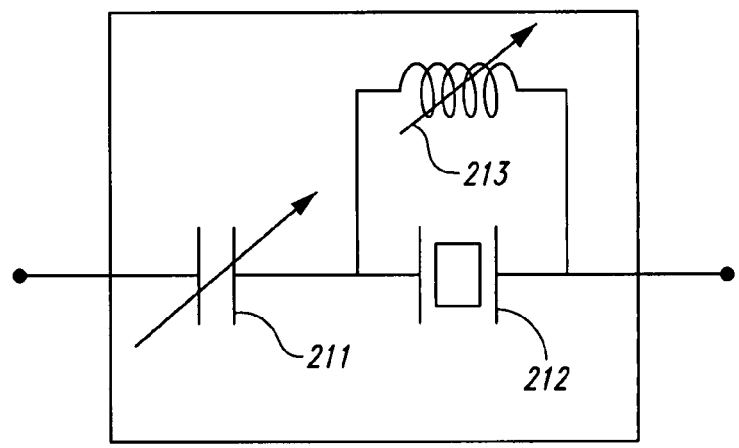
FIGS. 2a and 2b illustrate two embodiments of a tunable resonator component that is controlled by an electric signal.

FIG. 2a illustrates a first embodiment of a TRC in which the series resonance of a BAW resonator 212 is acted upon. To this end, an inductor 213 whose inductance is variable so that it can be adjusted in order to start resonating with the parallel capacity of the resonator (which is close to frequency $f_p$) or in the vicinity of this frequency, is assembled in parallel connection with resonator 212.

It is then possible to really act on the series resonance and control the resonant frequency by means of a capacitive tuning element 211.

Figure 1C:
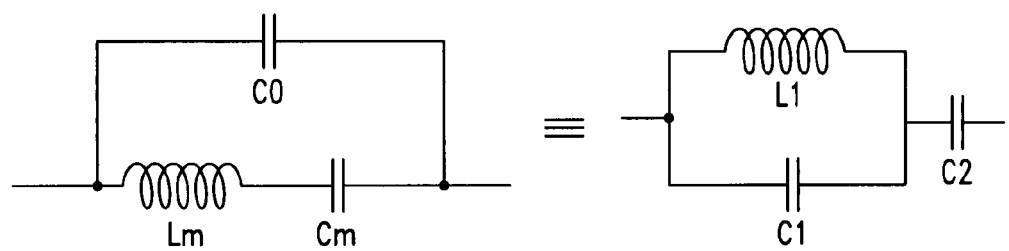
Figure 2B:
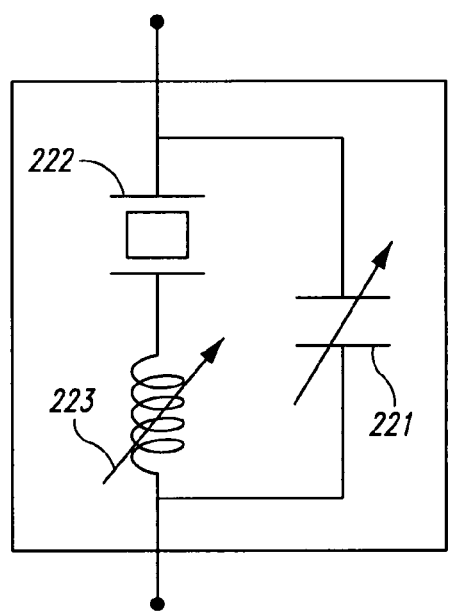

FIG. 2b corresponds to a second embodiment of a TRC in which the parallel resonance of a BAW resonator 222 is now acted upon. To this end, this time an inductor 223 that is variable in order to be adjusted so that it starts resonating with the equivalent series capacity (C2) close to frequency $f_s$ of the resonator of the FIG. 1c, or in the vicinity of this frequency, is connected in series with resonator 222. Then, a capacitive tuning element (221) is connected in parallel with both series elements, to interact with the parallel resonance of resonator 222 and set it to frequency $f_p$.

Thus, through the combined action of partner elements 221 and 223, it is possible to adjust the operational frequency—within a broad range—by means of tuning element 211 or 221 according to the case.

Thus, there is a true co-operation between tuning element 211 (or 221) and inductor 213 (resp. 223) that, by its action in the vicinity of both resonant and antiresonant frequencies of the acoustic resonator, reinforces the capacitive tuning effect of 211 (resp. 221).

This tunable resonator component provides great flexibility. It can be perfectly integrated into a semiconductor product and is particularly adapted to the design of a phase-locked loop, rendering it powerful because of the high quality coefficient of the acoustic resonator, associated with its two partner elements.

Figure 3:
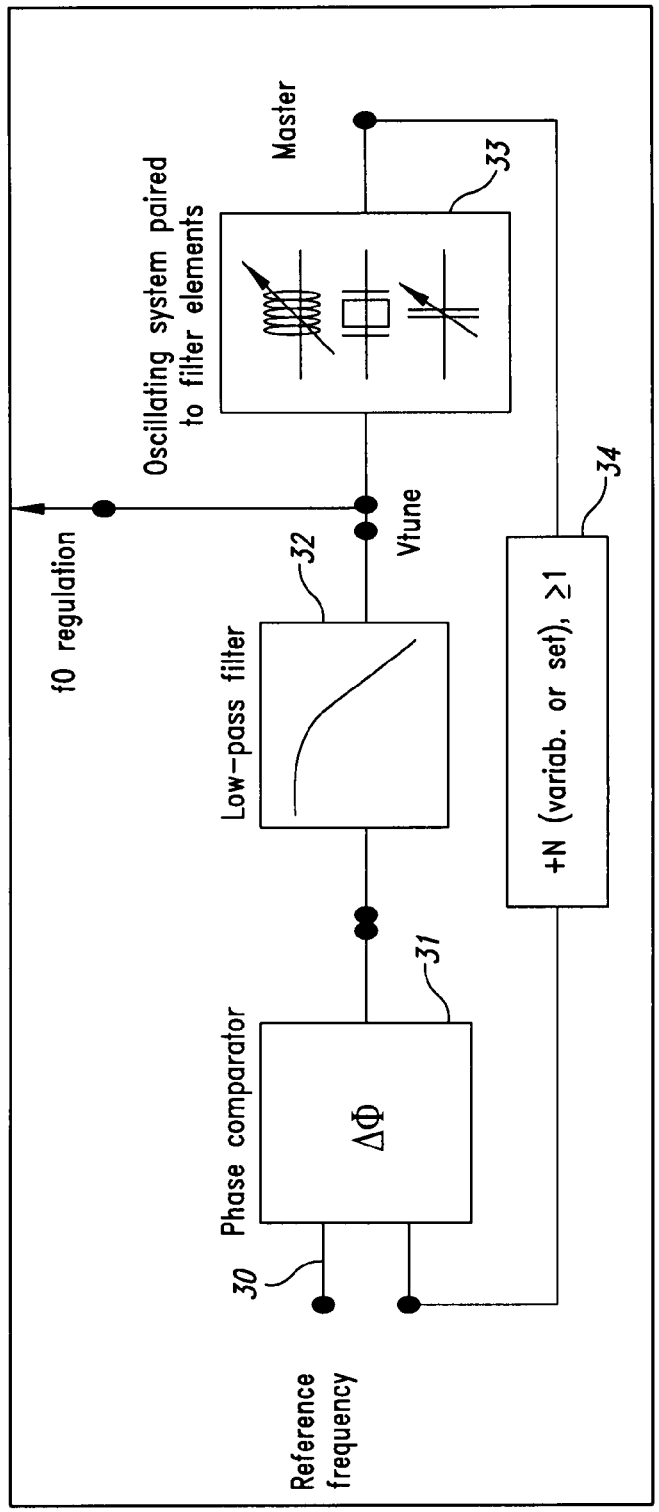
FIG. 3 illustrates an embodiment of a phase-locked loop incorporating the tunable acoustic resonator of FIGS. 2a and 2b.

FIG. 3 illustrates a phase-locked loop in accordance with an embodiment of the present invention, integrating the BAW tunable resonator component.

The loop comprises a phase comparator 31 having a first input 30 receiving a reference frequency. Phase comparator 31 has a second input receiving the output of a dividing element 34.

The output of the phase comparator is input to a low-pass filter 32 that, in turn, outputs a voltage $V_{tune}$ that is used to control one of the partner elements of the adjustable resonator component.

Figure 4A:
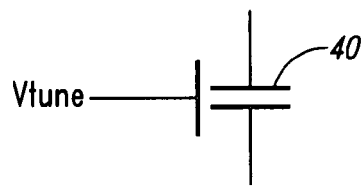
FIGS. 4a and 4b respectively describe control of the component by means of a varactor and an active inductor.

In a particular embodiment, as illustrated in FIG. 4a, the capacitive partner element associated with the BAW resonator is a varactor 40 whose control is ensured by voltage $V_{tune}$.

Figure 4B:
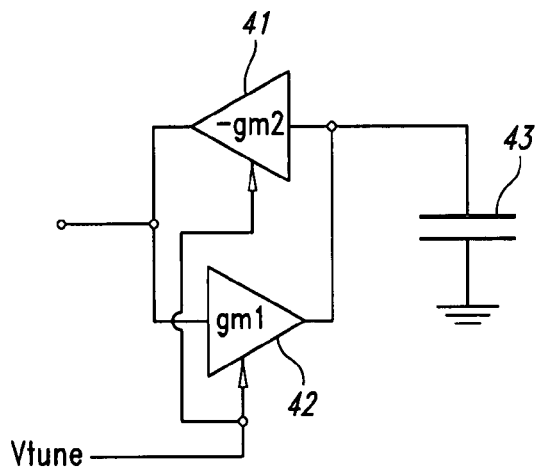

Alternatively, or cumulatively, as illustrated in FIG. 4b, the inductive partner element associated with the BAW resonator is an active inductor composed by of a pair of transconductance amplifiers 41 and 42, charged by a capacitor 43. In an embodiment, capacitor 43 is a varactor controlled by voltage $V_{tune}$. Voltage $V_{tune}$ can also be used to set the polarization point of transconductance amplifiers 41 and 42 and, thus, to regulate the value of the active inductor.

Figure 4C:
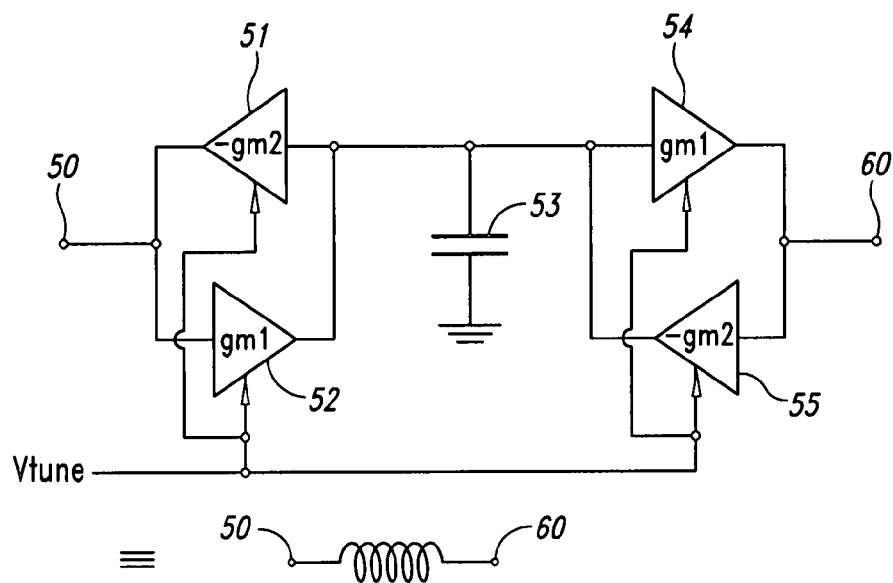
FIG. 4c illustrates an embodiment of a floating variable active inductor.

People qualified in the art will be able to consider any other way of realizing the partner elements of the BAW resonator. In particular, two gyrator elements could be combined to make a floating variable inductive element between two electrodes 50 and 60, as shown in FIG. 4c. To this end, a first gyrator composed of two head-to-tail transconductance amplifiers 51 and 52 is inserted between electrode 50 and capacitor 53, the second amplifier inducing a change in polarity change. Similarly, a second gyrator composed of two head-to-tail transconductance amplifiers 54 and 55 is inserted between electrode 60 and capacitor 53, with the second amplifier inducing a change in polarity.

Referring back to FIG. 3, it can be seen that resonator component 33 is integrated into an oscillator system and outputs a frequency that is transmitted to dividing block 34 that ensures division by a number N equal to or higher than 1, fixed or variable, integer or fractional.

Thus, an oscillation frequency is obtained, which is a multiple of N times the loop input frequency and is controlled by said input frequency.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A phase-locked loop that can be integrated into a semiconductor product, comprising:
   a phase comparator having a first input, a second input and an output, said first input receiving a reference frequency;
   a low-pass filter having an input connected to said output of said phase comparator and having an output generating an electric control signal;
   an oscillator circuit generating a predefined frequency to be controlled, including a BAW-type acoustic resonator having a resonant frequency and an antiresonant frequency; and
   a dividing block having an input receiving the oscillating signal and an output connected to said second input of said phase comparator;
   wherein said BAW-type acoustic resonator is associated with a first inductive partner element set in a vicinity of said resonant and antiresonant frequencies and is also associated with a second adjustable capacitive partner element to allow setting of said acoustic resonator's characteristics to provide a high quality coefficient for said acoustic resonator.

2. The phase-locked loop according to claim 1 wherein in that said BAW-type acoustic resonator is located on a same silicon semiconductor substrate as said loop.

3. The phase-locked loop according to claim 1 wherein said first partner element is a spiral inductor arranged on a same silicon semiconductor substrate.

4. The phase-locked loop according to claim 1 wherein said first partner element is an active inductor made up of a gyrator and a capacitive element.

5. The phase-locked loop according to claim 4 wherein said second partner element is a varactor that can be adjusted by said electric control signal.

6. The phase-locked loop according to claim 3 wherein said electric control signal is transmitted to the gyrator to set its polarization point.

7. The phase-locked loop according to claim 1 wherein said second partner element is a varactor controlled by said electric control signal.

8. An apparatus, comprising:
   a comparator having a first input terminal to receive a reference frequency, a second input terminal, and an output terminal;
   a filter having an input terminal coupled to the output terminal of the comparator and having an output terminal to provide a control signal;
   an oscillator to generate a frequency to be controlled, the oscillator having an output terminal and an input terminal coupled to the output terminal of the filter, the oscillator including a resonator having first and second frequencies, the resonator being associated with a first partner element having a characteristic that can be varied to tune the resonator to substantially the first frequency in response to the control signal, the resonator being associated with a second partner element having a characteristic that can be varied to substantially cancel the second frequency, said resonator being a bulk acoustic wave (BAW) type resonator having a high quality coefficient; and
   a dividing block having an input terminal coupled to the output terminal of the oscillator and having an output terminal coupled to the second input terminal of the comparator.

9. The apparatus of claim 8 wherein the filter comprises a low pass filter.

10. The apparatus of claim 8 wherein the comparator comprises a phase comparator.

11. The apparatus of claim 8 wherein the first partner element having the variable characteristic comprises a capacitive element having a variable capacitance, and wherein the second partner element having the variable characteristic comprises an inductive element having a variable inductance.

12. The apparatus of claim 11 wherein the capacitive element comprises a varactor that is controllable by the control signal.

13. The apparatus of claim 11 wherein the inductive element comprises a unit having a capacitance element coupled to a plurality of trasconductance elements, the unit being responsive to the control signal to vary the inductance of the inductive element.

14. The apparatus of claim 11 wherein the inductive element comprises a floating variable inductive unit having a capacitance element coupled to a plurality of gyrator elements, the floating variable inductive element responsive to the control signal to vary the inductance of the inductive element.

15. The apparatus of claim 8 wherein the comparator, filter, oscillator, and dividing block are arranged as a phase-locked loop on a same silicon semiconductor product substrate as the resonator.

16. A system, comprising:
a wireless device;
a semiconductor product included with the wireless device; and
an electronic circuit arranged on the semiconductor product, the electronic circuit having a phase-locked loop to provide a control signal, the phase-locked loop including:
a bulk acoustic wave (BAW) type resonator having first and second frequencies and having a high quality coefficient provided by:
a first partner element associated with the resonator to substantially cancel the first frequency; and
a second partner element associated with the resonator to tune the resonator to substantially the second frequency in response to the control signal.

17. The system of claim 16 wherein the phase-locked loop further includes:
a comparator having a first input terminal to receive a reference frequency, a second input terminal, and an output terminal;
a filter having an input terminal coupled to the output terminal of the comparator and having an output terminal to provide the control signal;
an oscillator to generate a frequency to be controlled, the oscillator having an output terminal and an input terminal coupled to the output terminal of the filter, the oscillator including the resonator and the first and second partner elements; and
a dividing block having an input terminal coupled to the output terminal of the oscillator and having an output terminal coupled to the second input terminal of the comparator.

18. The system of claim 16 wherein the resonator comprises a BAW resonator located on a same silicon substrate of the semiconductor product as the phase-locked loop.

19. The system of claim 16 wherein the first partner element comprises an inductive element having a variable inductance, and wherein the second partner element comprises a capacitive element having a variable capacitance.

20. A system, comprising:
phase-locked loop means for generating a control signal, the phase-locked loop means including a bulk acoustic wave (BAW) type resonator having first and second frequencies;
first and second element means for tuning to a vicinity of the first and second frequencies of the resonator, respectively;
means for varying a characteristic of the first element means to tune the first element means to the vicinity of the first frequency for substantially canceling the first frequency of the resonator; and
means responsive to the control signal from the phased-lock loop means for varying a characteristic of the second element means to provide said resonator with a high quality coefficient and to tune the resonator to substantially the second frequency, wherein said resonator and said first and second element means are present on a same silicon semiconductor substrate.

21. The system of claim 20 wherein the first element means comprises an inductive means for setting to the first frequency and having an inductance that can be varied in response to the control signal.

22. The system of claim 20 wherein the second element comprises a capacitive means for setting to the second frequency and having a capacitance that can be varied in response to the control signal.

23. A method for a bulk acoustic wave (BAW) type resonator having first and second frequencies, the method comprising:
coupling first and second partner elements to the BAW type resonator, said first and second partner elements providing said BAW type resonator with a high quality coefficient;
generating a control signal from a phase-locked loop;
varying a characteristic of the first partner element to tune the first partner element close to the first frequency to substantially cancel the first frequency; and
providing the generated control signal to the second partner element to adjust tuning of the resonator to the substantially the second frequency.

24. The method of claim 23 wherein varying the characteristic of the first partner element includes varying an inductance of the first partner element, and wherein providing the generated control signal to the second partner element to adjust tuning of the resonator includes providing the control signal to vary a capacitance of the second partner element.

25. The method of claim 23 wherein coupling the first and second partner elements to the resonator and generating the control signal from the phase-locked loop comprises arranging and operating the resonator and phase-locked loop on a same silicon semiconductor substrate.

* * * * *